United States Patent
Kobayakawa et al.

(10) Patent No.: US 9,722,157 B2
(45) Date of Patent: Aug. 1, 2017

(54) LED MODULE

(75) Inventors: Masahiko Kobayakawa, Kyoto (JP); Tomoichiro Toyama, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 269 days.

(21) Appl. No.: 13/638,248

(22) PCT Filed: Apr. 11, 2011

(86) PCT No.: PCT/JP2011/059014
§ 371 (c)(1),
(2), (4) Date: Sep. 28, 2012

(87) PCT Pub. No.: WO2011/126135
PCT Pub. Date: Oct. 13, 2011

(65) Prior Publication Data
US 2013/0020605 A1    Jan. 24, 2013

(30) Foreign Application Priority Data
Apr. 9, 2010 (JP) ................. 2010-090712

(51) Int. Cl.
*H01L 33/60* (2010.01)
*H01L 33/62* (2010.01)
*H01L 25/075* (2006.01)
*H01L 33/48* (2010.01)
*H01L 23/00* (2006.01)

(52) U.S. Cl.
CPC .............. *H01L 33/62* (2013.01); *H01L 24/73* (2013.01); *H01L 25/0753* (2013.01); *H01L 33/486* (2013.01); *H01L 33/60* (2013.01); *H01L 2224/32225* (2013.01); *H01L 2224/48227* (2013.01); *H01L 2224/48465* (2013.01); *H01L 2224/49107* (2013.01); *H01L 2224/49113* (2013.01); *H01L 2224/73265* (2013.01); *H01L 2924/01322* (2013.01)

(58) Field of Classification Search
None
See application file for complete search history.

(56) References Cited

U.S. PATENT DOCUMENTS 7,399,658 B2 *   7/2008   Shim et al. ............... 438/106
7,815,343 B2    10/2010   Nii et al.
(Continued)

FOREIGN PATENT DOCUMENTS

JP       7-199829 A     8/1995
JP       2003-264267    9/2003
(Continued)

OTHER PUBLICATIONS

Office Action issued in counterpart Japanese Patent Application No. 2012-509720 on Sep. 8, 2015 (3 pages).

*Primary Examiner* — Abul Kalam
(74) *Attorney, Agent, or Firm* — Hamre, Schumann, Mueller & Larson, P.C.

(57) ABSTRACT

An LED module according to the present invention includes an LED unit 2 and a case 1, where the LED unit includes an LED chip 21, and the case 1 includes a main body 11 made of a ceramic material and a pad 12a on which the LED unit 2 is mounted. The outer edge 121a of the pad 12a is positioned inward of the outer edge 2a of the LED unit 2 as viewed in plan. These arrangements prevent the light emission amount of the LED module A1 from reducing with time.

20 Claims, 11 Drawing Sheets

(56) References Cited

U.S. PATENT DOCUMENTS

| | | | |
|---|---|---|---|
| 8,614,544 B2 * | 12/2013 | Suzuki et al. | 313/326 |
| 2002/0160552 A1 * | 10/2002 | Minamio et al. | 438/108 |
| 2003/0038378 A1 * | 2/2003 | Jacobs | 257/783 |
| 2004/0079957 A1 * | 4/2004 | Andrews et al. | 257/100 |
| 2005/0156187 A1 | 7/2005 | Isokawa et al. | |
| 2006/0091416 A1 * | 5/2006 | Yan | 257/99 |
| 2006/0186430 A1 * | 8/2006 | Park et al. | 257/100 |
| 2007/0221940 A1 | 9/2007 | Okazaki | |
| 2008/0225449 A1 | 9/2008 | Inoue et al. | |
| 2009/0207580 A1 | 8/2009 | Oshika et al. | |
| 2009/0209064 A1 * | 8/2009 | Nonahasitthichai et al. | 438/110 |
| 2010/0044747 A1 * | 2/2010 | Tanaka | 257/99 |
| 2010/0090239 A1 * | 4/2010 | Lin et al. | 257/98 |
| 2010/0123162 A1 * | 5/2010 | Kondo et al. | 257/99 |
| 2010/0127300 A1 * | 5/2010 | Lee | H01L 33/62 257/99 |

FOREIGN PATENT DOCUMENTS

| | | |
|---|---|---|
| JP | 2005-167174 A | 6/2005 |
| JP | 2006-156603 | 6/2006 |
| JP | 2006-237141 | 7/2006 |
| JP | 2006-286944 | 10/2006 |
| JP | 2006-324317 A | 11/2006 |
| JP | 2006-324392 | 11/2006 |
| JP | 2007-258420 | 10/2007 |
| JP | 2008-41917 A | 2/2008 |
| JP | 2008-47834 | 2/2008 |
| JP | 2008-270327 | 11/2008 |

* cited by examiner

LED MODULE

TECHNICAL FIELD

The present invention relates to an LED module provided with an LED chip as the light source.

BACKGROUND ART

Figure 19:
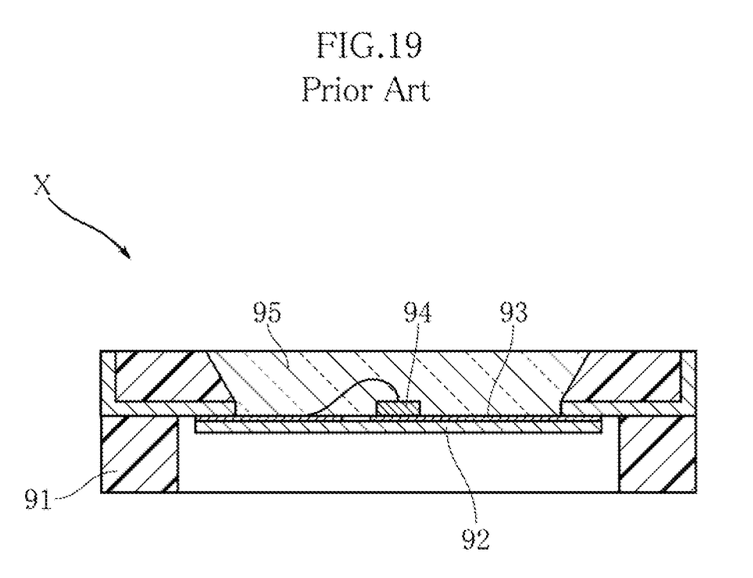
FIG. 19 is a sectional view showing an example of a conventional LED module.

FIG. 19 shows an example of conventional LED module (see e.g. Patent Document 1). The LED module X illustrated in the figure includes a case 91, a sub-mount substrate 92, a wising pattern 93, an LED chip 94 and a light-transmitting portion 95. The case 91 is made of e.g. resin. The sub-mount substrate 92 is made of e.g. Si. The wiring pattern 93 is formed on the sub-mount substrate 92 and has an obverse surface made of e.g. Au or Ag. The LED chip 94 is the light source of the LED module X and emits light of a predetermined wavelength. The LED chip 94 is mounted to the sub-mount substrate 92 by eutectic bonding to the wiring pattern 93. The light-transmitting portion 95 is made of a material that transmits light from the LED chip 94, such as silicone resin, and covers the LED chip 94.

After long use of the LED module X, the material such as Ag that forms the obverse surface of the wiring pattern 93 is corroded and changes to a dark color. The wiring pattern 93 that has changed to a dark color in this way absorbs light emitted from the LED chip 94. Thus, the amount of light emission from the LED module X may reduce with time.

Patent Document 1: JP-A-2006-237141

SUMMARY OF THE INVENTION

Problems to be Solved by the Invention

The present invention has been conceived in view of the above-described situation, and it is an object of the present invention to provide an LED module that is configured to suppress reduction of light emission with time.

Means for Solving the Problems

An LED module provided according to a first aspect of the present invention comprises: at least one LED unit including an LED chip; and a case including a main body made of a ceramic material and at least one pad for mounting the LED unit. The pad includes an outer edge that is positioned inward of the outer edge of the LED unit as viewed in plan.

According to a second aspect of the present invention, in the LED module of the first aspect, the pad includes an obverse surface made of Ag or Au.

According to a third aspect of the present invention, in the LED module of the first or the second aspect, the main body is white.

According to a fourth aspect of the present, invention, the LED module of any one of the first through the third aspects further comprises at least one wire including an end bonded to the LED unit. The case further comprises at least one banding pad to which another end of the wire is bonded and which is positioned on the outer side of the pad as viewed in plan.

According to a fifth aspect of the present invention, in the LED module of any one of the first through the fourth aspects, the main body further comprises a reflector surrounding the LED unit, and the reflector is provided with a recess that accommodates at least a part of the bonding pad as viewed in plan.

According to a sixth aspect of the present invention, in the LED module of any one of the first through the fifth aspects, the case further comprises: at least one mounting electrode provided on an opposite side from the pad; and a penetration conductor penetrating the main body and connecting one of the pads and one of the mounting electrodes to each other.

According to a seventh aspect of the present invention, in the LED module of any one of the first through the sixth aspects, the LED unit consists of the LED chip only.

According to an eighth aspect ox the present invention, in the LED module of any one of the first through the sixth aspects, the LED unit further comprises a sub-mount substrate on which the LED chip is mounted.

According to a ninth aspect, of the present invention, in the LED module of any one of the first through the eighth aspects, the above-mentioned pad comprises a plurality of pads arranged in a plurality of rows, and the above-mentioned LED-unit comprises a plurality of LED units mounted on the plurality of pads, respectively.

According to a tenth aspect of the present invention, in the LED module of any one of the first through the ninth aspects, the LED unit and the pad are bonded to each other by eutectic bonding.

According to an eleventh aspect of the present invention, the LED module of any one of the first through the tenth aspects further comprises a light-transmitting portion covering the LED unit. The light-transmitting portion is made up of a resin material and a fluorescent substance, where the resin material is configured to transmit light from the LED unit, and the fluorescent substance is configured to be excited by the light from the LED unit, thereby emitting light of a wavelength different from that of the light from the LED unit.

Other features and advantages of the present invention will become more apparent from detailed description given below with reference to the accompanying drawings.

MODE FOR CARRYING OUT THE INVENTION

Preferred embodiments of the present invention are described below with reference to the accompanying drawings.

FIGS. 1-5 show an example of LED module according to the present invention. The LED module A1 of this embodiment includes a case 1, a plurality of LED units 2, a Zener diode 3, wires 4 and a light-transmitting portion 5 (not shown in FIG. 1). The LED module A1 is an LED module of a high output type that provides a relatively high brightness and is about 5 mm×5 mm as viewed in plan and about 0.9 mm in thickness.

Figure 1:
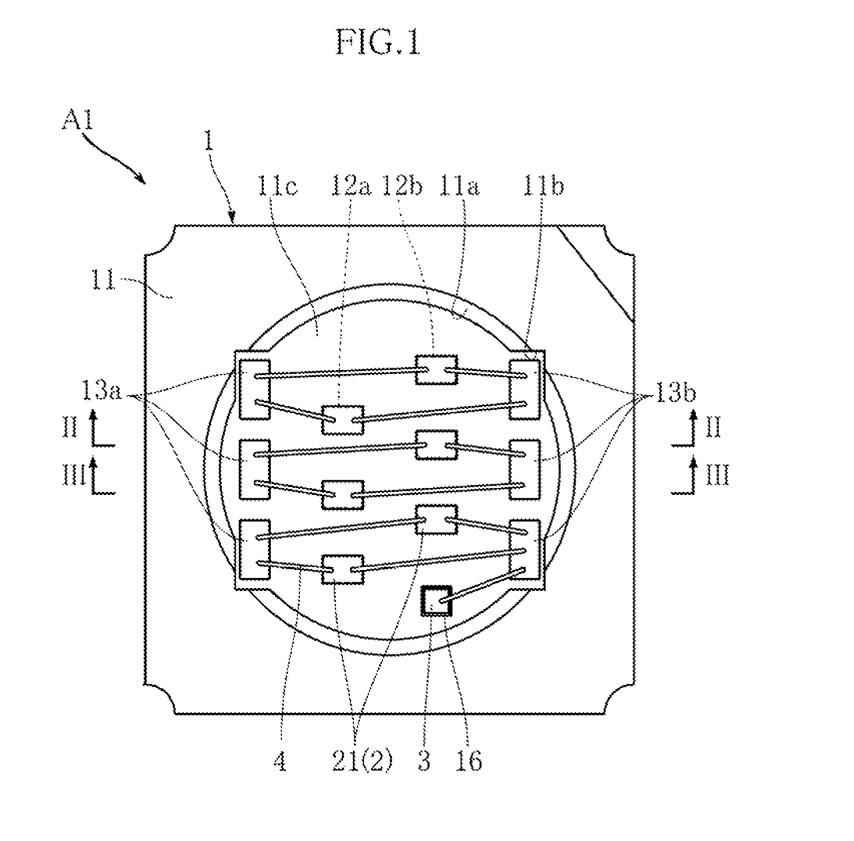
FIG. 1 is a plan view showing an LED module according to a first embodiment of the present invention.

The case 1 includes a main body 11, a plurality of pads 12a and 12b, a plurality of bonding pads 13a and 13b, a pad 16, a pair of mounting electrodes 14a and 14b, and a plurality of penetration conductors 15a, 15b, 15c and 15d. The case 1 is made of a white ceramic material such as alumina. The main body 11 has a reflector 11a and a bottom surface 11c. The reflector 11a reflects the light traveling generally horizontally from the LED chip 21 in FIG. 2 to direct the light upward in the figure. In this embodiment, the reflector 11a is provided with four recesses 11b. Each of the four recesses 11b has a triangular cross section as viewed in plan and reaches the bottom surface 11c. The bottom surface 11c is generally circular and connected to the bottom edge of the reflector 11a.

The pads 12a and 12b are formed on the bottom surface 11c. In this embodiment, three pads 12a and three pads 12b are arranged in two rows. Each of the pads 12a, 12b is rectangular and made of a plurality of plated layers laminated from the bottom surface 11c side in the order of e.g. Ag, Ni, Au or Ag, Ni, Ag or W, Ni, Ag or S, Ni, Au. When the top layer is made of Ag, the Ag layer is made to have a thickness of about 2.5 μm. When the top layer is made of Au, the Au layer is made to have a thickness of about 0.1 μm.

The bonding pads 13a, 13b are formed on the bottom surface 11c. In this embodiment, three bonding pads 13a and three bonding pads 13b are arranged in two rows. Each of the bonding pads 13a, 13b is rectangular and made of plated layers similar to those of the pads 12a, 12b. About one third of each of the four bonding pads 13a, 13b positioned at four corners is accommodated in a respective one of the four recesses 11b.

The pad 16 is arranged adjacent to the edge of the bottom surface 11c and made of plated layers similar to those of the pads 12 and the bonding pads 13.

Figure 4:
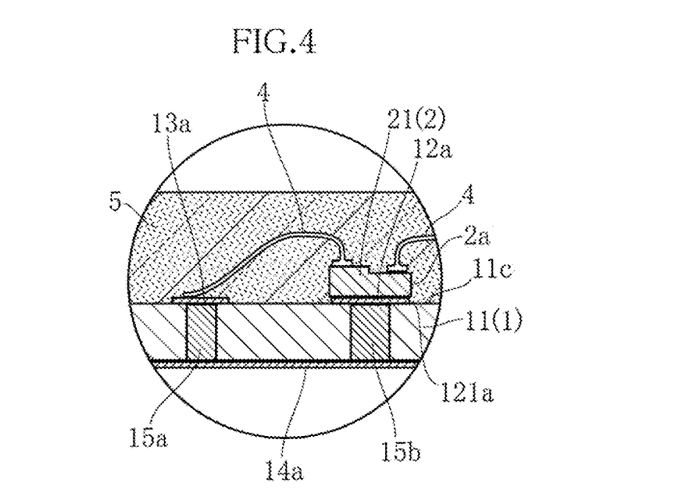
FIG. 4 is an enlarged sectional view of a principal portion of the LED module according to the first embodiment of the present invention.
Figure 5:
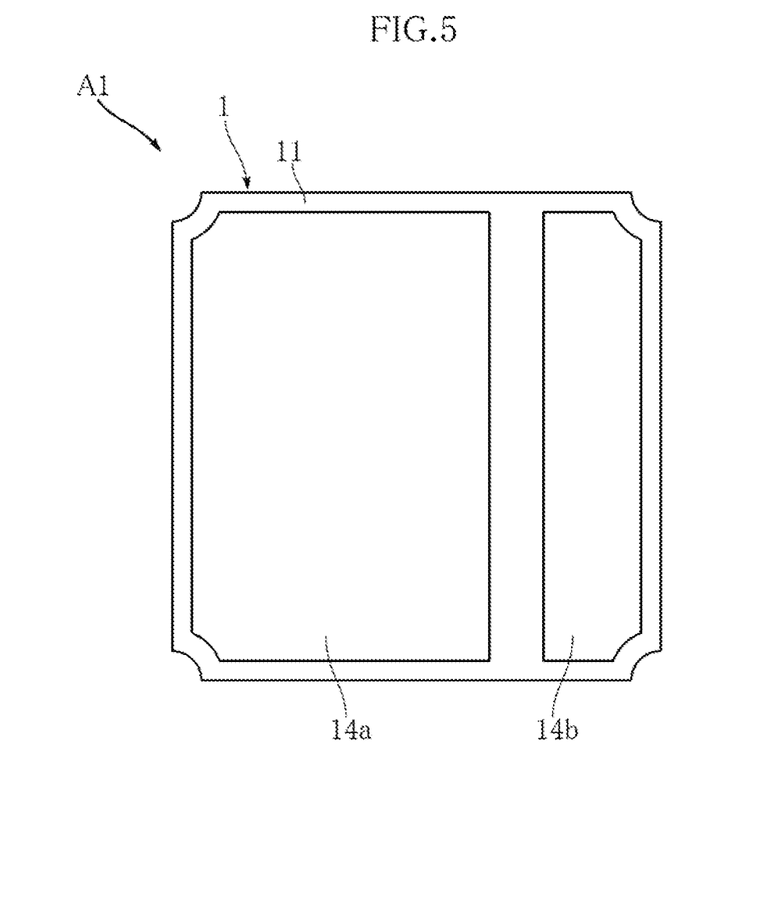
FIG. 5 is a bottom view of the LED module according to the first embodiment of the present invention.
Figure 6:
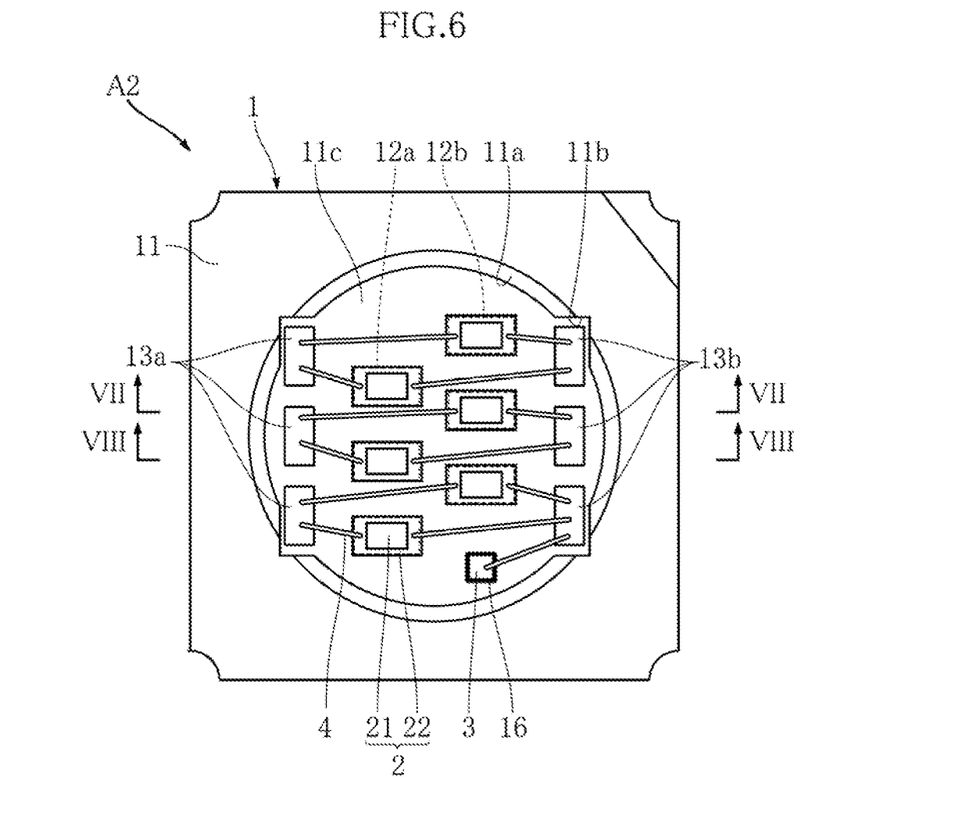
FIG. 6 is a plan view showing an LED module according to at second embodiment of the present invention.
Figure 7:
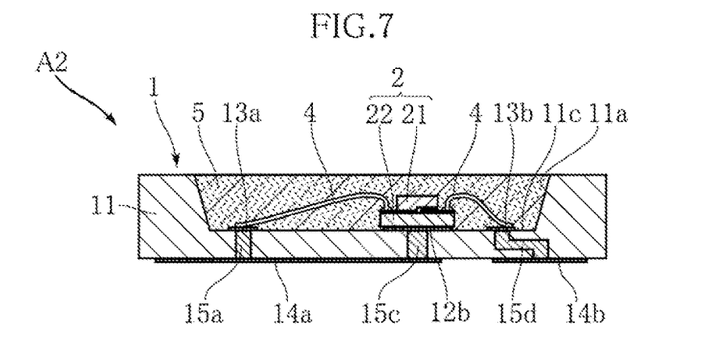
FIG. 7 is a sectional view taken along lines VII-VII in FIG. 6.
Figure 8:
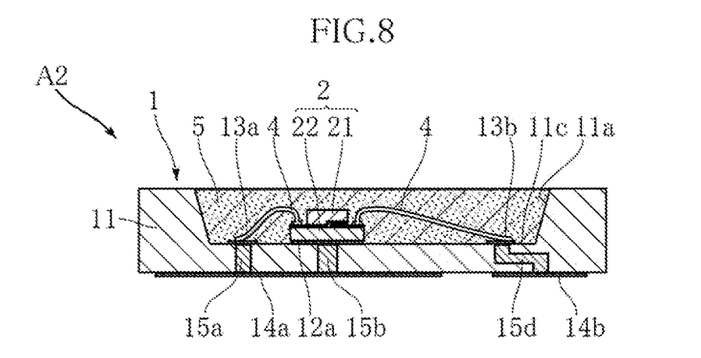
FIG. 8 is a sectional view taken along lines VIII-VIII in FIG. 6.

As shown in FIG. 4, the paired mounting electrodes 14a and 14b are generally rectangular and formed on a surface of the main body 11 opposite from the surface provided with the reflector 11a and the bottom surface 11c. As shown in the figure, the mounting electrode 14a is considerably larger than the mounting electrode 14b and overlaps the LED chips 21 as viewed in plan.

Figure 2:
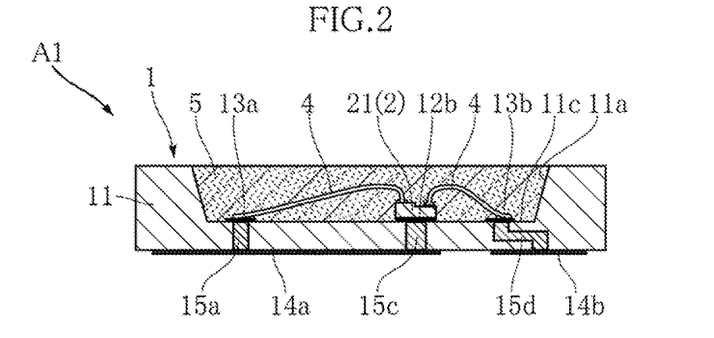
FIG. 2 is a sectional view taken along lines II-II in FIG. 1.
Figure 3:
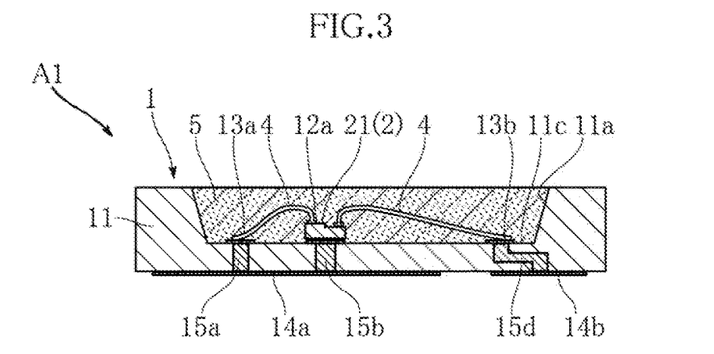
FIG. 3 is a sectional view taken along lines III-III in FIG. 1.

The penetration conductors 15a, 15b, 15c and 15d are made of e.g. Ag or W and penetrate the main body 11. In this embodiment, three penetration conductors 15a connect the three bonding pads 13a to the mounting electrode 14a. Three penetration conductors 15b connect the three pads 12a to the mounting electrode 14a. Three penetration conductors 15c connect the three pads 12b to the mounting electrode 14a. The single penetration conductor 15c connects the pad 16 to the mounting electrode 14a. Three penetration conductors 15d connect the three bonding pad 13b to the mounting electrode 14b and are in the form of a crank.

The case 1 having this structure can be made by laminating a ceramic material, an Ag material or a W material in an appropriate order, then baking these materials, and then performing plating.

The LEO units 2 are the light source of the LED module A1 and comprise a plurality of LED chips 21 in this embodiment. Each LED chip 21 includes an n-type semiconductor layer made of e.g. GaN-based semiconductor, a p-type semiconductor layer, and an active layer sandwiched between these layers, and emits blue light. The LED chips 21 are bonded to the pads 12a, 12b by eutectic bonding. The size or each LED chip 21 as viewed in plan is larger than that of each pad 12a, 12b. That is, as shown in FIG. 4, the outer edge 121a of each pad 12a is positioned slightly inward of the outer edge 2a of the LED unit 2 (LED chip 21) as viewed in plan. This holds true for the outer edge of each pad 12b. In this embodiment, the LED chips 21 are configured as a two-wire LED chip.

The Zener diode 3 prevents application of excessive reverse voltage to the LED chips 21 and allows current to flow in a reverse direction only when an excessive reverse voltage above a certain value is applied. The Zener diode 3 is bonded to the pad 16 via e.g. Ag paste.

The wires 4 are made of e.g. Au. Each of the wires 4 is bonded at one end to the bonding pad 13a or 13b and bonded at the other end to one of the LED chips 21 or the Zener diode 3.

The light-transmitting portion 5 fills the region surrounded by the reflector 11a and the bottom surface 11c and covers the LED chips 21, the Zener diode 3 and the wires 4. The light-transmitting portion 5 is made of e.g. transparent silicone resin with a fluorescent substance mixed in it. For instance, the fluorescent substance emits yellow light when excited by the blue light from the LED chips 21. The yellow light mixes with the blue light from the LED chips 21, whereby white light is emitted from the LED module A1. Instead of such a fluorescent substance, use may be made of a fluorescent substance that emits red light when excited by blue light and a fluorescent material that emits green light when excited by blue light.

The advantages of the LED module A1 are described below.

According to this embodiment, the pads 12a, 12b are covered by the LED chips 21. Thus, even when the pads 12a, 12b change to a dark color with time, light from the LED chips 21 traveling toward the bottom surface 11c is not absorbed by the pads 12a, 12b but reflected by the bottom surface 11c. Thus, reduction of light emission amount of the LED module with time is suppressed, and the LED module A1 offers high brightness.

Although the bonding pads 13a, 13b are not completely covered by the LED chips 21 or the wires 4, the bonding pads 13a, 13b are provided on the outer side of the LED chips 21 and spaced apart from the LED chips 21. This prevents light from the LED chips 21 from, being absorbed by the bonding pad 13a, 13b.

The provision of the recesses 11b in the reflector 11a allows the reflector 11a to be arranged relatively close to the LED chips 2. Such an arrangement is suitable for increasing the brightness of the LED module A1. The main body 11, which is made of a ceramic material, can transmit light from the LED chips 21, though the amount is small. Arranging the reflector 11a relatively close to LED chips 21 allows the site of the portion of the main body 11 which is on the outer side of the reflector 11a to be increased without changing the outer dimensions of the main body 11. Thus, unfavorable leak of the light from the LED chips 21 to the sides through the main body 11 is prevented.

The penetration conductors 15b, 15c do not carry out electrical function but conduct the heat generated at the LED chips 21 from the pads 12a, 12b to the mounting electrode 14a. With this arrangement, heat is efficiently dissipated from the LED chips 21, which makes it possible to apply high current to the LED chips 21. This is advantageous for increasing the brightness of the LED module A1.

FIGS. 6-18 show other embodiments of the present invention. In these figures, the elements that are identical or similar to those of the foregoing embodiment, are designated by the same reference signs as those used for the foregoing embodiment.

FIGS. 6-9 show an LED module according to a second embodiment of the present invention. The LED module A2 of this embodiment is different from the foregoing embodiment in structure of the LED units 2. Specifically, in this embodiment, each LED unit 2 comprises an LED chip 21 and a sub-mount substrate 22.

Figure 9:
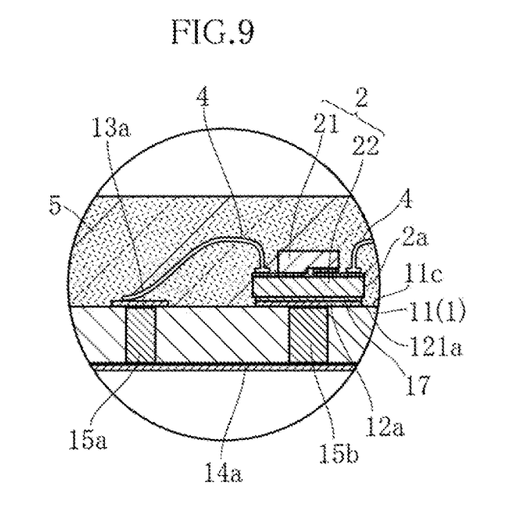
FIG. 9 is an enlarged sectional view of a principal portion of the LED module according to the second embodiment of the present invention.
Figure 10:
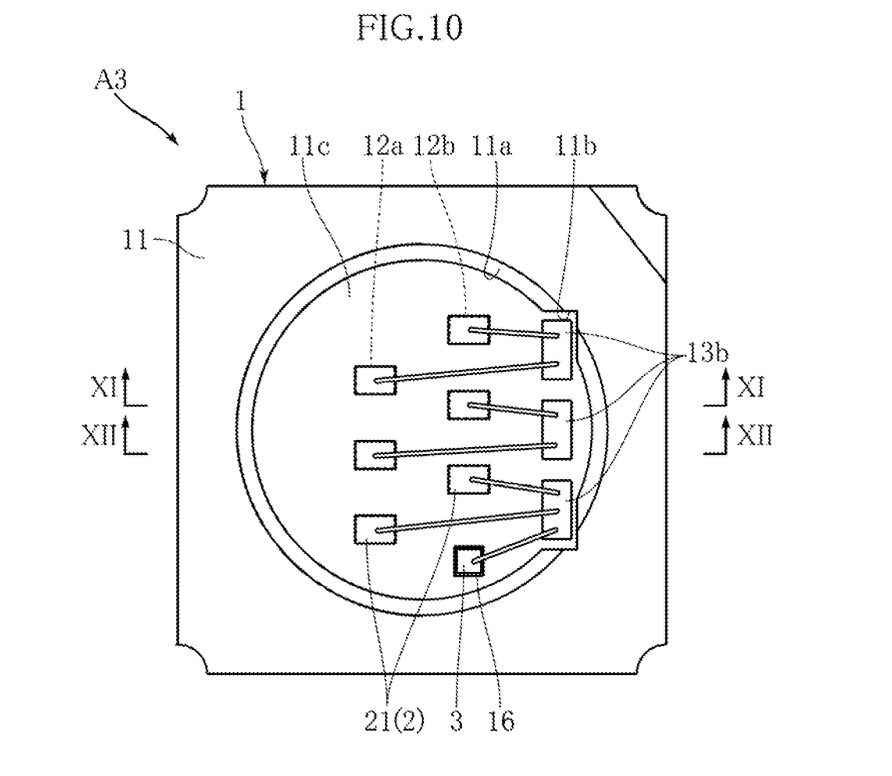
FIG. 10 is a plan view showing an LED module according to a third embodiment of the present invention.
Figure 11:
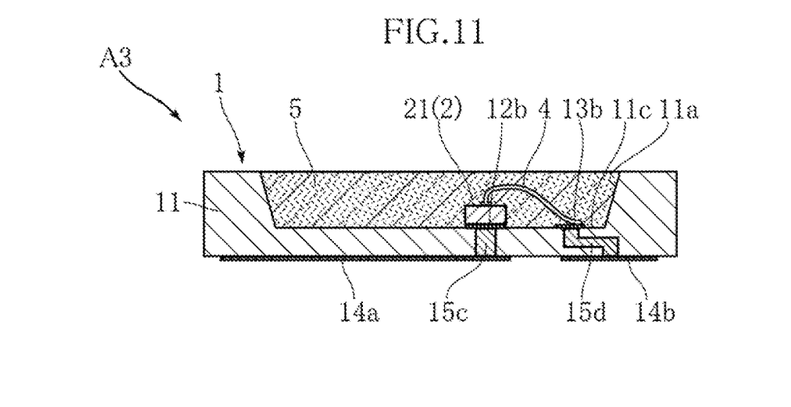
FIG. 11 is a sectional view taken along lines XI-XI in FIG. 10.
Figure 12:
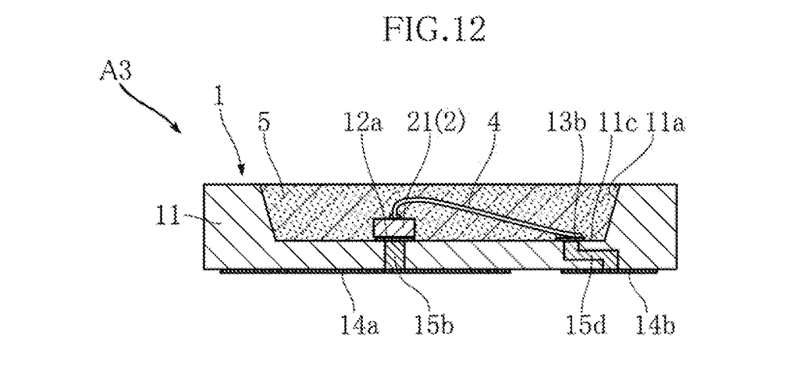
FIG. 12 is a sectional view taken along lines XII-XII in FIG. 10.

The sub-mount substrate 22 is made of e.g. Si, and the LED chip 21 is mounted on the sub-mount substrate. The sub-mount substrate 22 has a wiring pattern formed on it. The wiring pattern is electrically connected to an electrode (not shown) of the LED chip 21, and includes a portion extending into a region that is not covered by the LED chip 21. In this embodiment, wires 4 are bonded to the wiring pattern. As shown in FIG. 9, the sub-mount substrate 22 is bonded to the pad 12a or 12b with e.g. Ag paste 17. This bonding may be performed by eutectic bonding.

The size of each pad 12a, 12b as viewed in plan is smaller than that of the sub-mount substrate 22. As shown in FIG. 9, the outer edge 121a of each pad 12a is positioned slightly inward of the outer edge 2a of the LED unit 2 (sub-mount substrate 22) as viewed in plan. This holds true for the outer edge of each pad 12b.

According to this embodiment again, reduction of light emission amount of the LED module with time is suppressed, and the LED module A2 offers high brightness.

FIGS. 10-13 show an LED module according to a third embodiment of the present invention. The LED module A3 of this embodiment is different from the foregoing embodiments in structure of the LED units 2. Specifically, in this embodiment, each LED unit 2 consists of an LED chip 21 only and is structured as a single-wire LED unit. Since each LED unit 2 is a single-wire LED unit, the bonding pads 13a and the penetration conductors 15, which are provided in the cases 1 of the LED modules A1 and A2, are not provided in this embodiment.

In this embodiment, electrodes (not shown) are formed on the upper surface and the lower surface of each LED chip 21. To the electrode on the upper surface is bonded a wire 4. The electrode on the lower surface is bonded to the pad 12a or 12b by e.g. eutectic bonding.

Figure 13:
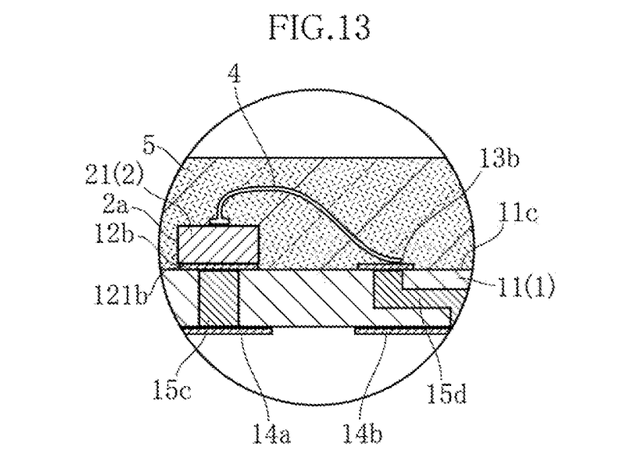
FIG. 13 is an enlarged sectional view of a principal portion of the LED module according to the third embodiment of the present invention.
Figure 14:
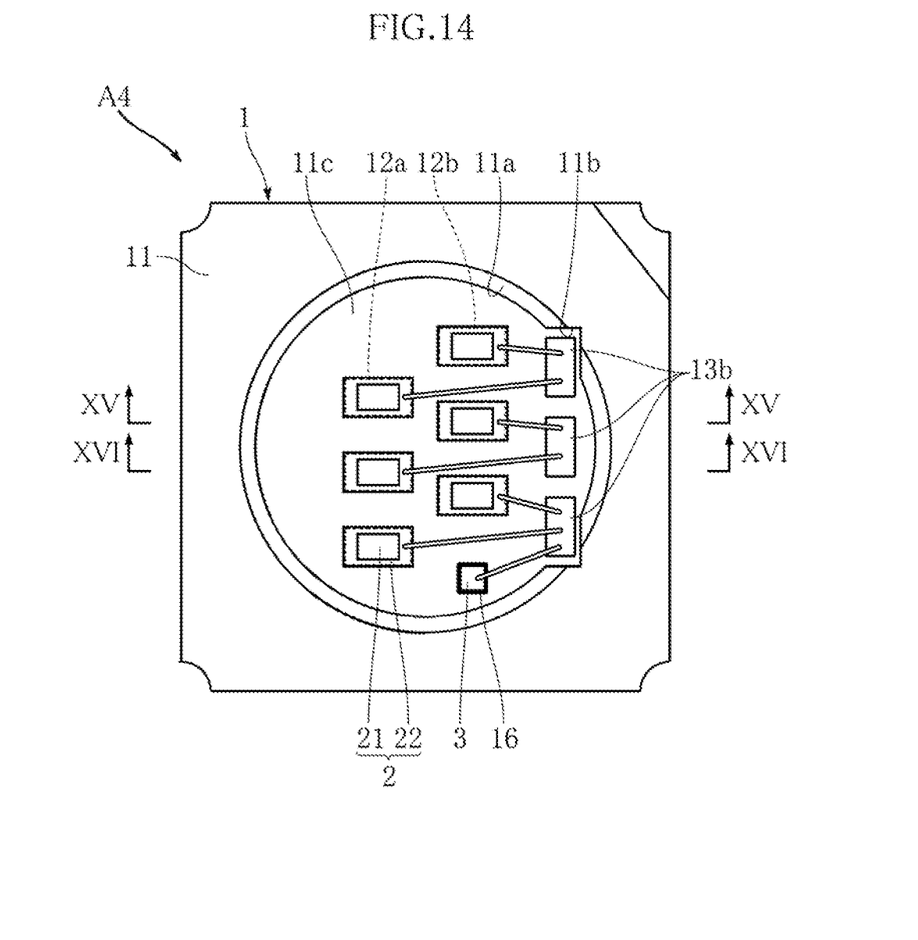
FIG. 14 is a plan view showing an LED module according to a fourth embodiment of the present invention.
Figure 15:
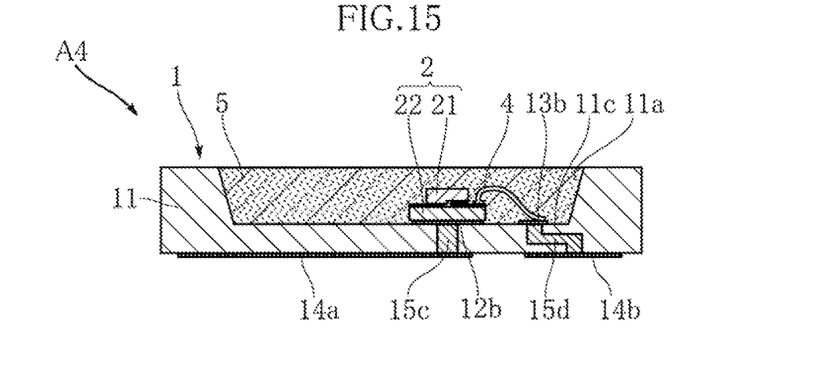
FIG. 15 is a sectional view taken along lines XV-XV in FIG. 14.
Figure 16:
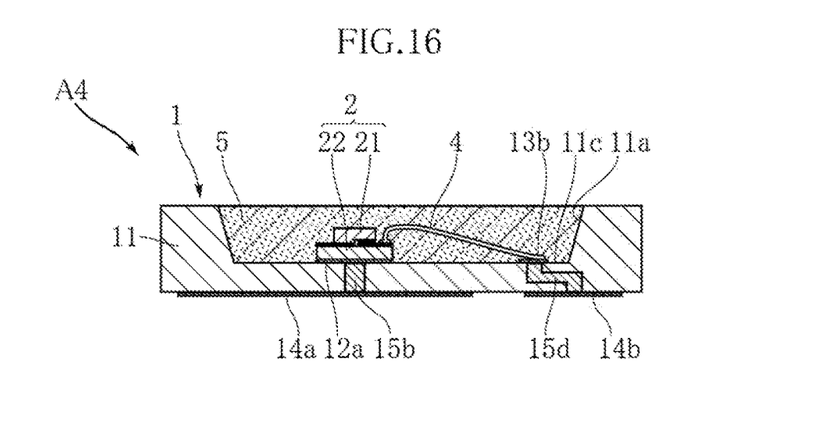
FIG. 16 is a sectional view taken along lines XVI-XVI in FIG. 14.

The size of each pad 12a, 12b as viewed in plan is smaller than that of each LED chip 21. As shown in FIG. 13, the outer edge 121b of each pad 12b is positioned slightly inward of the outer edge 2a of the LED unit 2 (LED chip 21) as viewed in plan.

According to this embodiment again, reduction of light emission amount of the LED module A3 with time is suppressed, and the LED module A3 offers high brightness.

FIGS. 14-17 show an LED module according to a fourth embodiment of the present invention. The LED module A4 of this embodiment is different from the foregoing embodiments in structure of the LED units 2. In this embodiment, each LED unit 2 is made up of an LED chip 21 and a sub-mount substrate 22 and structured as a single-wire LED unit.

The sub-mount substrate 22 is made of e.g. Si, and the LED chip 21 is mounted on the sub-mount substrate. The sub-mount substrate 22 has a wiring pattern formed on it via an insulating film. The wiring pattern is electrically connected to an electrode (not shown) of the LED chip 21, and includes a portion extending into a region that is not covered by the LED chip 21. In this embodiment, a wire 4 is bonded to the wiring pattern. The sub-mount substrate 22 is made a conductor by e.g. doping. Another electrode (not shown) of the LED chip 21 is held in contact with and electrically connected to the sub-mount substrate 22. The sub-mount substrate 22 is bonded to the pad 12a or 12b with e.g. Ag paste 17. This bonding may be performed by eutectic bonding.

Figure 17:
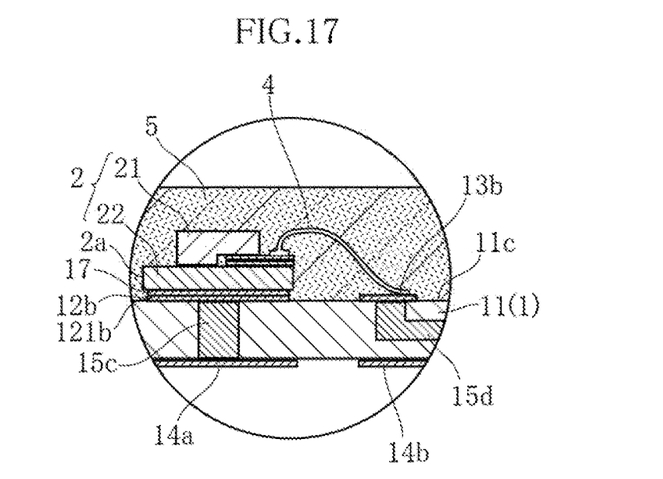
FIG. 17 is an enlarged sectional view of a principal portion of the LED module according to the fourth embodiment of the present invention.

In this embodiment again, the size of each pad 12a, 12b as viewed in plan is smaller than that of the sub-mount substrate 22. As shown in FIG. 17, the outer edge 121b of each pad 12b is positioned slightly inward of the outer edge 2a of the LED unit 2 (sub-mount substrate 22) as viewed in plan.

According to this embodiment again, reduction of light emission amount of the LED module A4 with time is suppressed, and the LED module A4 offers high brightness.

Figure 18:
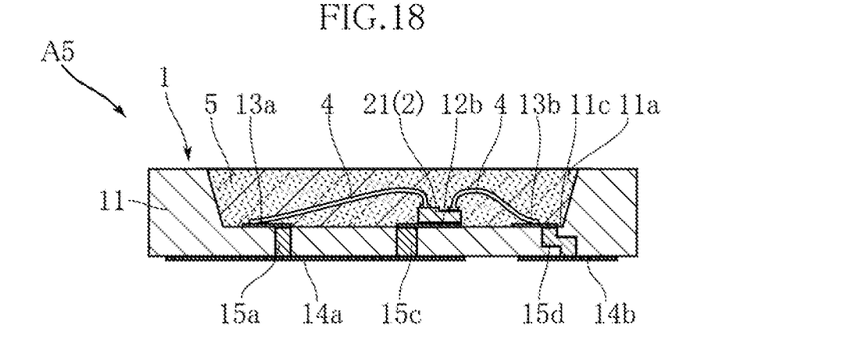
FIG. 18 is a sectional view showing an LED module according to a fifth embodiment of the present invention.

FIG. 18 shows an LED module according to a fifth embodiment of the present invention. The LED module A5 of this embodiment has the same structure as that of the LED module A1 except that the structure of the penetration conductors 15a, 15b, 15c, 15d are different. Though penetration conductor 15b is not shown in this figure, the penetration conductor 15b has the same structure as that of the penetration conductor 15c.

In this embodiment, the penetration conductor 15c is provided at a position that avoids the LED unit 2 (LED chip 21) as viewed in plan. The pad 12b and the penetration conductor 15c are electrically connected to each other via a plated layer extending from the pad 12b, The penetration conductors 15a, 15d are provided at positions that avoid bonded portions of the wires as viewed in plan.

According to this embodiment again, reduction of light emission amount of the LED module A5 with time is suppressed, and the LED module A5 offers high brightness.

The LED module according to the present invention is not limited to the foregoing embodiments. The specific structure of each part of the LED module according to the present invention can be varied in design in many ways.

The plurality of LED chips 21 may emit light of different wavelengths. The shape of the bottom surface 11c is not limited to a circular shape. The light-transmitting portion 5 may be made of a transparent material only.

The invention claimed is:

1. An LED module comprising:
a plurality of LED units each including an LED chip;
a case including a main body made of a ceramic material, a plurality of element pads for mounting the plurality of LED units and a reflector, the main body having an obverse surface and a reverse surface, the plurality of element pads being disposed on the obverse surface, the reflector being formed on the main body and surrounding the plurality of LED units;
first, second, third, and fourth wire bonding pads, each spaced apart from any of the plurality of element pads and the plurality of LED units as viewed in plan,
wherein the first and the second wire bonding pads are spaced apart from each other in a first direction, the third and the fourth wire bonding pads are spaced apart from each other in the first direction, the first and the third wire bonding pads are spaced apart from each other in a second direction perpendicular to the first direction, and the second and the fourth wire bonding pads are spaced apart from each other in the second direction; and
first, second, third, and fourth wires bonded to the first, the second, the third, and the fourth wire bonding pads, respectively,
wherein the case further comprises at least one mounting electrode provided on an opposite side from the plurality of element pads and disposed on the reverse surface,
the main body of the case is formed with a through-hole including a first opening formed in the obverse surface and a second opening formed in the reverse surface, at least a part of one of the plurality of element pads being disposed directly above the first opening, at least a part of the at least one mounting electrode being disposed directly below the second opening,
the first opening of the through-hole overlaps with one of the plurality of LED units as viewed in a thickness direction of the main body, the first opening being smaller in area than the one of the plurality of LED units as viewed in the thickness direction, and
the first wire extends from the first wire bonding pad toward the second wire bonding pad as viewed in plan, the second wire extends from the second wire bonding pad toward the first wire bonding pad as viewed in plan, the third wire extends from the third wire bonding pad toward the fourth wire bonding pad as viewed in plan, and the fourth wire extends from the fourth wire bonding pad toward the third wire bonding pad as viewed in plan.

2. The LED module according to claim 1, wherein each of the plurality of element pads includes an obverse surface made of Ag or Au.

3. The LED module according to claim 1, wherein the main body is white.

4. The LED module according to claim 1,
wherein one of the first, the second, the third, and the fourth wires has a first end bonded to the one of the plurality of LED units, and the first, the second, the third, and the fourth wire bonding pads are positioned on an outer side of the plurality of element pads as viewed in plan, and
the first end of the one of the first, the second, the third, and the fourth wires does not overlap with the first opening as viewed in plan.

5. The LED module according to claim 4, wherein
the reflector is provided with a recess that accommodates at least a part of one of the first, the second, the third, and the fourth wire bonding pads, the recess having a first straight edge and a second straight edge as viewed in plan, the first straight edge being parallel to one edge of the one of the first, the second, the third, and the fourth wire bonding pads, the second straight edge being parallel to another edge of the one of the first, the second, the third, and the fourth wire bonding pads.

6. The LED module according to claim 1, wherein the case further comprises a penetration conductor penetrating the main body and connecting the mounting electrode to one pad selected from a group of the plurality of element pads and the first, the second, the third, and the fourth wire bonding pads.

7. The LED module according to claim 1, wherein each of the plurality of LED units consists of the LED chip only.

8. The LED module according to claim 1, wherein each of the plurality of LED units further comprises a sub-mount substrate on which the LED chip is mounted.

9. The LED module according to claim 1, wherein the plurality of element pads are arranged in a plurality of rows.

10. The LED module according to claim 1, wherein the plurality of LED units and the plurality of element pads are bonded to each other by eutectic bonding.

11. The LED module according to claim 1, further comprising a light-transmitting portion covering the plurality of LED units, wherein the light-transmitting portion is made up of a resin material and a fluorescent substance, the resin material transmitting light from the plurality of LED units, the fluorescent substance being excited by the light from the plurality of LED units, thereby emitting light of a wavelength different from that of the light from the plurality of LED units.

12. The LED module according to claim 1, wherein each of the plurality of element pads is made up of a plurality of plated layers including an upper layer, a middle layer and a lower layer.

13. The LED module according to claim 12, wherein the upper layer is made of one of Ag and Au, the middle layer is made of Ni, and the lower layer is made of one of Ag and W.

14. The LED module according to claim 1, wherein each of the first, the second, the third, and the fourth wire bonding pads is made up of a plurality of plated layers including an upper layer, a middle layer and a lower layer.

15. The LED module according to claim 14, wherein the upper layer is made of one of Ag and Au, the middle layer is made of Ni, and the lower layer is made of one of Ag and W.

16. The LED module according to claim 6, wherein the penetration conductor is bent.

17. The LED module according to claim 16, wherein the penetration conductor includes two end portions and an intermediate portion connecting the two end portions to each other, each of the two end portions extending in the thickness direction of the main body, the intermediate portion extending in a direction perpendicular to the thickness direction.

18. The LED module according to claim 1, further comprising a Zener diode connected at least to the LED chip of one of the plurality of LED units.

19. The LED module according to claim 1, wherein each of the plurality of element pads is spaced apart from the first, the second, the third, and the fourth wire bonding pads in the first direction.

20. The LED module according to claim 1, wherein one or more of the plurality of element pads are disposed on one side of a virtual line perpendicular to the first direction, and the remaining one or ones of the plurality of element pads are disposed on the other side of the virtual line.

* * * * *